United States Patent
Satake et al.

(10) Patent No.: US 8,425,786 B2
(45) Date of Patent: Apr. 23, 2013

(54) PLASMA ETCHING METHOD AND PLASMA ETCHING APPARATUS

(75) Inventors: Makoto Satake, Kokubunji (JP); Kenji Maeda, Kudamatsu (JP); Kenetsu Yokogawa, Tsurugashima (JP); Tsutomu Tetsuka, Kasumigaura (JP); Tatehito Usui, Kasumigaura (JP); Ryoji Nishio, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 425 days.

(21) Appl. No.: 12/700,903

(22) Filed: Feb. 5, 2010

(65) Prior Publication Data

US 2011/0100954 A1    May 5, 2011

(30) Foreign Application Priority Data

Nov. 5, 2009    (JP) .................. 2009-253770

(51) Int. Cl.
   *B44C 1/22*    (2006.01)
   *C25F 3/00*    (2006.01)
(52) U.S. Cl.
   USPC .............................................. 216/22; 216/11
(58) Field of Classification Search .............. 216/22, 216/11
   See application file for complete search history.

(56) References Cited

FOREIGN PATENT DOCUMENTS

JP    2004-356179    * 12/2004

OTHER PUBLICATIONS

Machine translation of JP 2004-356179 (2004).*
P.C. Cosby, Electron-impact dissociation of carbon monoxide, J. Chem. Phys. May 15, 1993, pp. 7804-7818, vol. 98, No. 10.
Pramod Subramonium, Two-dimensional modeling of long-term transients in inductively coupled plasmas using moderate computational parallelism. II. Ar/$Cl_2$ pulsed plasmas, J. Vac. Sci. Technol. A, Mar./Apr. 2002, pp. 325-334, vol. 20, No. 2.
J. Krutein et al. Measurements of vibrational excitation of $N_2$, CO, and NO by low energy proton impact, J. Chem. Phys. Jul. 15, 1979, pp. 599-604, vol. 71, No. 2.

* cited by examiner

*Primary Examiner* — Duy Deo
*Assistant Examiner* — Mahmoud Dahimene
(74) *Attorney, Agent, or Firm* — Antonelli, Terry, Stout & Kraus, LLP.

(57) ABSTRACT

In processing a magnetic film composed for example of Fe, Co or Ni formed on a substrate and a nonvolatile metal containing the same in a vacuum reactor using a plasma generating gas for generating plasma and a gas containing C and O, a power applied to an antenna for generating plasma is time-modulated, wherein the feeding of gas containing C and O to the vacuum reactor is synchronized with the time-modulated antenna power so that the supply of gas containing C and O to the vacuum reactor is suppressed when the antenna power is high and the gas containing C and O is fed to the vacuum reactor when the antenna power is low.

9 Claims, 7 Drawing Sheets

PLASMA ETCHING METHOD AND PLASMA ETCHING APPARATUS

The present application is based on and claims priority of Japanese patent application No. 2009-253770 filed on Nov. 5, 2009, the entire contents of which are hereby incorporated by reference.

BACKGROUND OF THE INVENTION

1. Field of the Invention

The present invention relates to a plasma etching method and a plasma etching apparatus for processing an object such as a magnetic film used in magnetoresistive memories, for example.

2. Description of the Related Art

Along with the recent increase of information volume, electronic devices are desired to consume less power, and memories are desired to realize high-speed operation and be nonvolatile. Examples of currently used memories include DRAM (dynamic random access memory) utilizing charge accumulation and flash memory. DRAM is used as the main memory of computers, but it is volatile and loses its memory when power is turned off.

Further, data must be rewritten every given period of time to maintain data during operation, so that it consumes a large amount of power. On the other hand, flash memories are nonvolatile memories, but the writing time of information thereto is slow, which is in the order of μ seconds. Thus, the application of an MRAM (magnetic random access memory) which is a nonvolatile memory that realizes a high-speed operation and low consumption power that overcomes the drawbacks of the prior art memories is expected.

MRAM is a memory that utilizes the change of resistance value due to the orientation of magnetization, and the fabrication thereof adopts a technique related to microfabrication of a magnetic film composed of Fe, Co or Ni formed on a substrate and a nonvolatile metal containing these elements via dry etching using a mask formed by lithography. Further, a similar technique is also adopted in the field of processing magnetic heads using magnetic materials.

Dry etching can be classified into a method using ion beam etching and a method using plasma etching. The plasma etching method is especially adopted widely in the fabrication of semiconductor devices, and has superior productivity since it enables to process large-diameter substrates uniformly. However, if the magnetic film is subjected to microfabrication via plasma etching using halogen-based gas such as F, Cl and Br that had been conventionally used, processing becomes difficult since the vapor pressure of the halogen compounds of the magnetic film is low. Further, since corrosion occurs when the halogen compounds adhered to the magnetic film is exposed to the moisture in the atmosphere, an extra anticorrosion process must be performed.

An etching method using gas containing CO, which includes carbon C and oxygen O as contents, is gaining attention as a method for overcoming the above-mentioned problem. This method utilizes the phenomenon that a metal carbonyl $M(CO)_x$ (x being an arbitrary number) with high vapor pressure is produced by the reaction between the metal material M constituting the magnetic film and CO, and the method is suitably applied for processing magnetic films since it does not cause any corrosion.

However, in general, CO is easily dissociated in plasma by the following reactions:

The drawback of the above method is that CO is reduced by the above-described reaction and metal carbonyl cannot be generated efficiently, and that the C generated by the dissociation is deposited on the magnetic film and inhibits etching.

In order to solve the problem, it becomes necessary to suppress the dissociation of CO in the plasma and generate an active species of CO so as to promote the reaction between the magnetic film and the CO.

Patent document 1 (Japanese patent application laid-open publication No. 2004-356179) discloses a method of creating a high density plasma region by feeding plasma generating gas such as Ar to the upper area of the apparatus, and feeding CO gas to the afterglow region created at the lower area of the apparatus to thereby suppress the dissociation of CO.

Further, non-patent document 1 (Electron-impact dissociation of carbon monoxide (P. C. Cosby, J. Chem. Phys. 98 (10), 1993) and non-patent document 2 (The Theory of Rotating Diatomic Molecules (edited by M. Mizushima (Willy, New York, 1975) respectively disclose reports on the dissociation energy of CO, the vibration excitation energy of CO and the electron excitation energy of CO, and non-patent document 3 (Pramod Subramonium et al.: J. Vac. Sci. Technol. A20(2), 2002) disclose a report on the relationship between the on and off of antenna power and the plasma density.

SUMMARY OF THE INVENTION

In order to etch the magnetic film efficiently via plasma etching using CO gas, it is necessary to suppress the dissociation of CO in the plasma and to generate active species for promoting the reaction between the magnetic film and CO.

Figure 7:
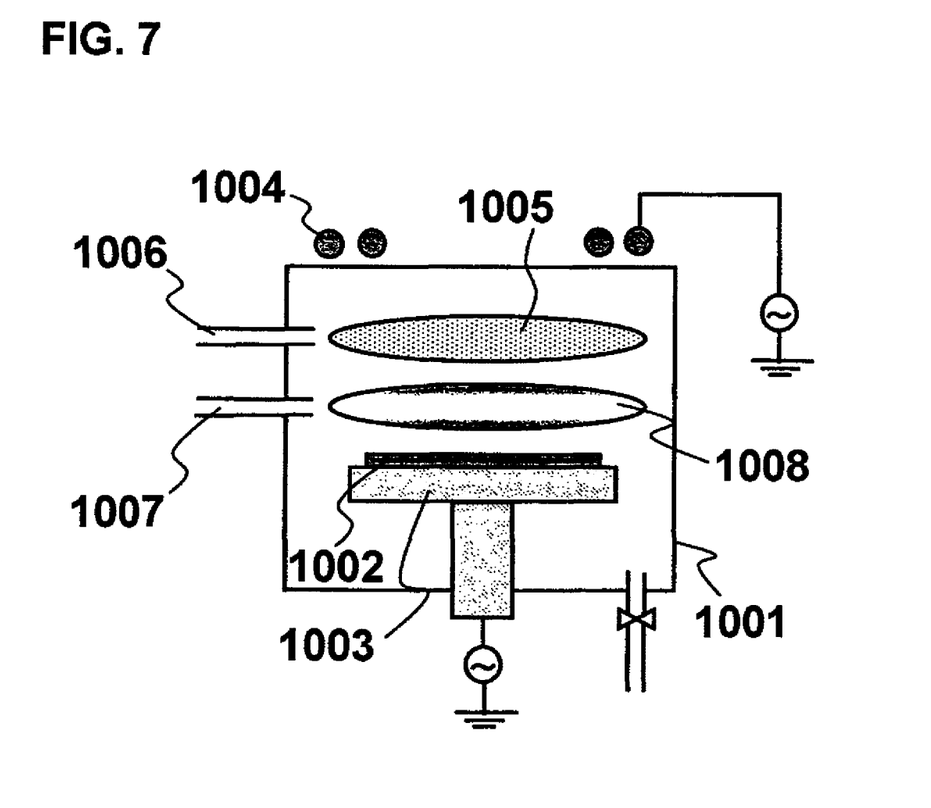
FIG. 7 is a schematic structural view of the prior art plasma etching apparatus using CO gas.

FIG. 7 shows a schematic structural view of an apparatus disclosed in patent document 1 for suppressing the dissociation of CO and etching a magnetic film and the like. The apparatus includes a substrate holder 1003 for supporting a substrate 1002 disposed at the center of the lower area of a vacuum reactor 1001, wherein a high-density plasma region 1005 generated via an antenna 1004 is formed at the upper area of the vacuum reactor 1001 by adopting an inductively-coupled plasma method, and a first gas inlet 1006 is disposed so as to feed plasma generating gas such as Ar to the high density plasma region. Further, a second gas inlet 1007 is disposed at an intermediate position between the first gas inlet 1006 and the substrate 1002, enabling gas containing CO to be fed to an afterglow region 1008 through the second gas inlet 1007. According to this arrangement, CO is fed to the low-density afterglow region, reaching the substrate 1002 before colliding against the high-temperature high-density plasma gas and being dissociated. In addition, a method for applying a time-modulated plasma via the antenna 1004 to lower the electron temperature and suppress dissociation is also disclosed.

However, according to the processing pressure in the range of 0.1 Pa to 13 Pa used in normal plasma etching, the diffusion coefficient of gas is high, and for example, the computed mutual diffusion coefficient of Ar and CO when the processing pressure is 1 Pa and the gas temperature is 300 K is 1.93 $m^2/s$, which is extremely high. Therefore, the CO that should only be fed to the lower afterglow region is also easily diffused to the high-temperature high-density plasma region formed to the upper area of the apparatus, according to which the C dissociated in the region inhibits the etching process.

Patent document 1 also discloses a method of time-modulating the power applied to the antenna so that the power is turned on and off at given intervals, by which the electron temperature can be reduced while maintaining the plasma density, so as to suppress the dissociation of CO.

Figure 2:
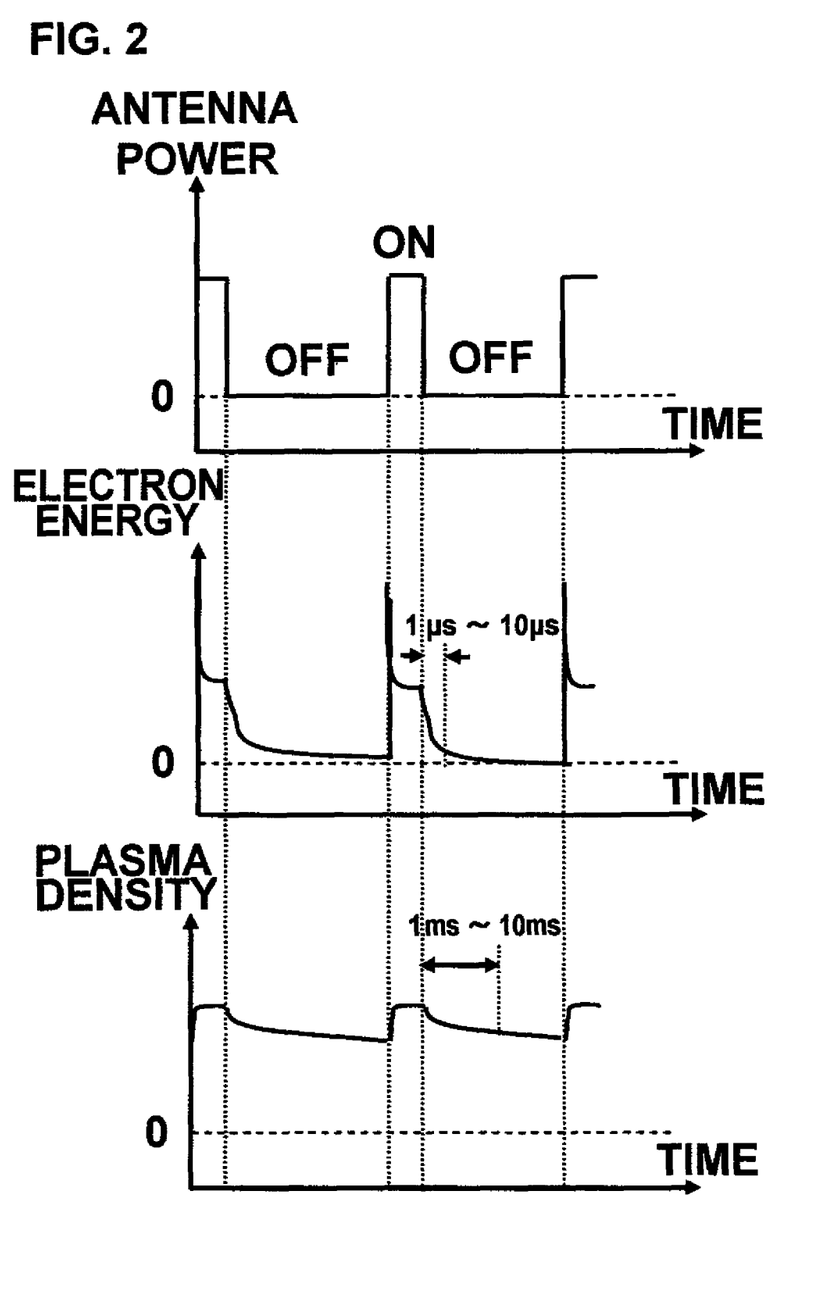
FIG. 2 is a graph showing the variation of plasma density and electron temperature when the antenna power is time-modulated.

FIG. 2 shows a time variation of antenna power, electron temperature and plasma density when the antenna power is subjected to time modulation.

Time modulation enables to maintain the plasma density and simultaneously reduce the time average of electron temperature, but as shown in FIG. 2, the electron temperature rises when the antenna power is turned on.

Therefore, if CO is fed to the high-temperature high-density plasma region, the dissociation of CO when the power is turned on inhibits the etching in a similar manner, even if the ICP power is time-modulated.

As described, it can be seen that in the attempt to suppress the dissociation of CO and generate the active species of CO, it is extremely difficult to suppress the dissociation of CO by merely applying the method of isolating the space within the vacuum reactor to two plasma-status regions, a high-density plasma region and an afterglow region, since the CO gas is diffused to the high-density plasma region. The same problem also occurs by using gases containing C and O other than CO gas, such as $CH_3OH$, $C_2H_5OH$, $C_3H_7OH$ and $CO_2$.

The object of the present invention is to provide a method and apparatus for performing plasma etching using a gas containing C and O for processing a magnetic film with high efficiency, that adopts a method other than spacially separating the plasma statuses, to suppress the dissociation of gas containing C and O in the plasma and to generate an active species for promoting the reaction between the magnetic film and the gas containing C and O.

In order to solve the above-described problems, the present invention provides a plasma etching method and a plasma etching apparatus having the following technical features.

(1) The present invention provides a plasma etching method for processing a magnetic film composed for example of Fe, Co or Ni formed on a substrate and nonvolatile metal containing the same in a vacuum reactor using plasma generating gas for generating plasma and a gas containing C and O, wherein a power applied to an antenna for generating plasma is subjected to time modulation, and the feeding of the gas containing C and O is synchronized with the time-modulated antenna power so that the feeding of the gas containing C and O into the vacuum reactor is suppressed when the antenna power is high and the gas containing C and O is fed to the vacuum reactor when the antenna power is low.

(2) In the above-mentioned plasma etching method, the plasma generating gas is fed to the vacuum reactor in synchronization when the time-modulated antenna power is high.

(3) In the above-mentioned plasma etching method, the plasma generating gas and the gas containing C and O are mixed and fed to the vacuum reactor when the time-modulated antenna power is low.

(4) In the above-mentioned plasma etching method, when the time-modulated antenna power is low, the amount of gas containing C and O fed to the vacuum reactor is varied with time, and at the instant when the antenna power becomes high, the feeding of gas containing C and O to the vacuum reactor is stopped.

(5) In the above-mentioned plasma etching method, rare gas such as He, Ar or Xe or a mixed gas containing the same is used as the plasma generating gas.

(6) In the above-mentioned plasma etching method, a mixed gas composed of the gas containing C and O and $H_2$ or a mixed gas composed of the gas containing C and O and $NH_3$ is used instead of the gas containing C and O.

(7) In the above-mentioned plasma etching method, CO, $CH_3OH$, $C_2H_5OH$, $C_3H_7OH$ or $CO_2$ is used as the gas containing C and O.

(8) In the above-mentioned plasma etching method, the power when the time-modulated antenna power is low is $\frac{1}{10}$ or smaller of the power when the antenna power is high.

(9) The present invention also provides a plasma etching apparatus for processing a magnetic film composed for example of Fe, Co or Ni formed on a substrate and nonvolatile metal containing the same in a vacuum reactor using plasma generating gas for generating plasma and a gas containing C and O, comprising a time modulation method for time-modulating the power applied to an antenna for generating plasma, and a gas controller for controlling an opening of a first flow rate control valve disposed on a feed path for feeding the gas containing C and O to the vacuum reactor, wherein the time modulation method and the gas controller are synchronized so as to suppress the opening of the first flow rate control valve when the antenna power being modulated by the time modulation method is high and to increase the opening of the first flow rate control valve when the antenna power is low.

(10) In the above-mentioned plasma etching apparatus, the gas controller also controls the opening of a second flow rate control valve disposed on a feed path for feeding the plasma generating gas to the vacuum reactor, wherein the time modulation method and the gas controller are synchronized so as to increase the opening of the second flow rate control valve when the antenna power being modulated by the time modulation method is high and to suppress the opening of the second flow rate control valve when the antenna power is low.

(11) In the above-mentioned plasma etching apparatus, the plasma generating gas and the gas containing C and O are fed through separate inlets.

(12) In the above-mentioned plasma etching apparatus, gas inlets are provided at an upper portion of the vacuum reactor, wherein the gas containing C and O is fed through a center-side gas inlet and the plasma generating gas is fed through an outer-side gas inlet.

According to the present invention, the power applied to the antenna is time-modulated, and plasma generating gas is fed to the vacuum reactor when the antenna power is at high time to generate plasma while CO gas is fed to the vacuum reactor when the antenna power is low, such as when the electron temperature is as low as 1 eV or smaller, to suppress the dissociation of gas containing C and O while generating active species for promoting the reaction between the magnetic film and the gas containing C and O, to thereby etch the magnetic film formed on the substrate with high efficiency.

DETAILED DESCRIPTION OF THE PREFERRED EMBODIMENTS

Now, the preferred embodiments using CO (carbon monoxide) gas as gas containing C and O will be described with reference to the drawings.

In order to suppress the dissociation of CO while generating an active species for promoting the reaction between the magnetic film and CO, it is necessary to increase the major portion of the electron energy in the plasma to be greater than the excitation energy of CO and smaller than the dissociation energy of CO.

Non-patent document 1 reports that the dissociation energy of CO is 11.2 eV, and non-patent document 2 reports that the vibrational excitation energy is 0.266 eV and the electron excitation energy is 5.898 eV. Therefore, it is recognized that by setting the major portion of the electron energy to be greater than 0.266 eV and smaller than 11.2 eV, it becomes possible to suppress the dissociation of CO while generating the active species of CO.

Figure 3:
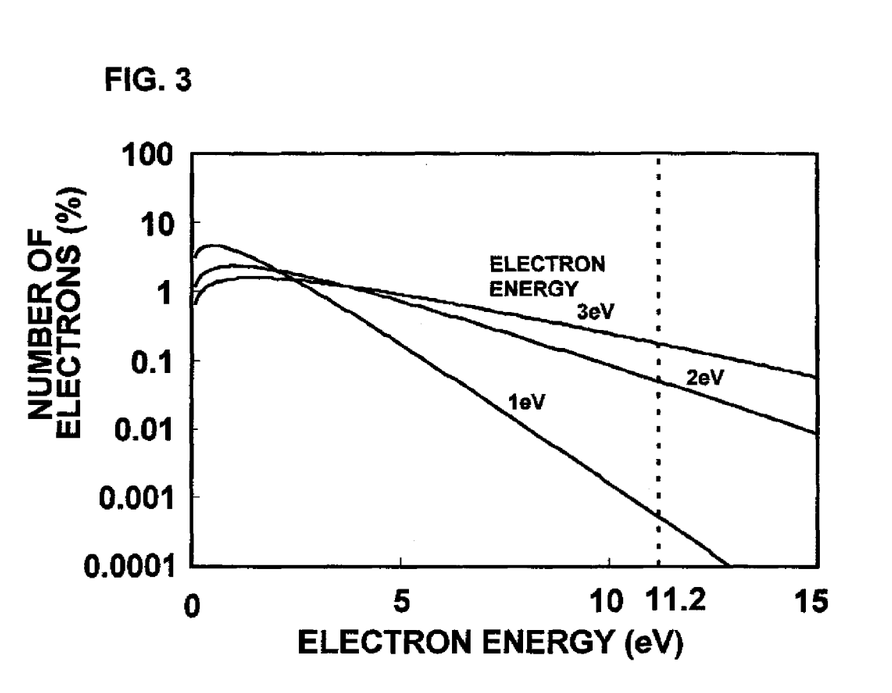
FIG. 3 is a graph showing the energy distribution of electrons at respective electron temperatures.

FIG. 3 shows the result of computing the energy distribution of electrons within the plasma at various electron temperatures.

In FIG. 3, the horizontal axis represents the energy value of electrons, and the vertical axis represents the ratio of electrons at respective energies using logarithm when the total number of electrons is assumed to be 100.

According to this computation, when the electron temperature used in the normal plasma process is 2 to 3 eV, electrons having an energy of 11.2 eV or greater occupy 1 to 5.5% of the whole electrons, but when the electron temperature is 1 eV or smaller, the electrons having an energy of 11.2 eV or greater constitute only 0.006% or smaller of the whole electrons, or in other words, are substantially eliminated.

Therefore, when the electron temperature is equal to or smaller than 1 eV, the active species of CO can be generated efficiently while suppressing the dissociation of CO.

Figure 1:
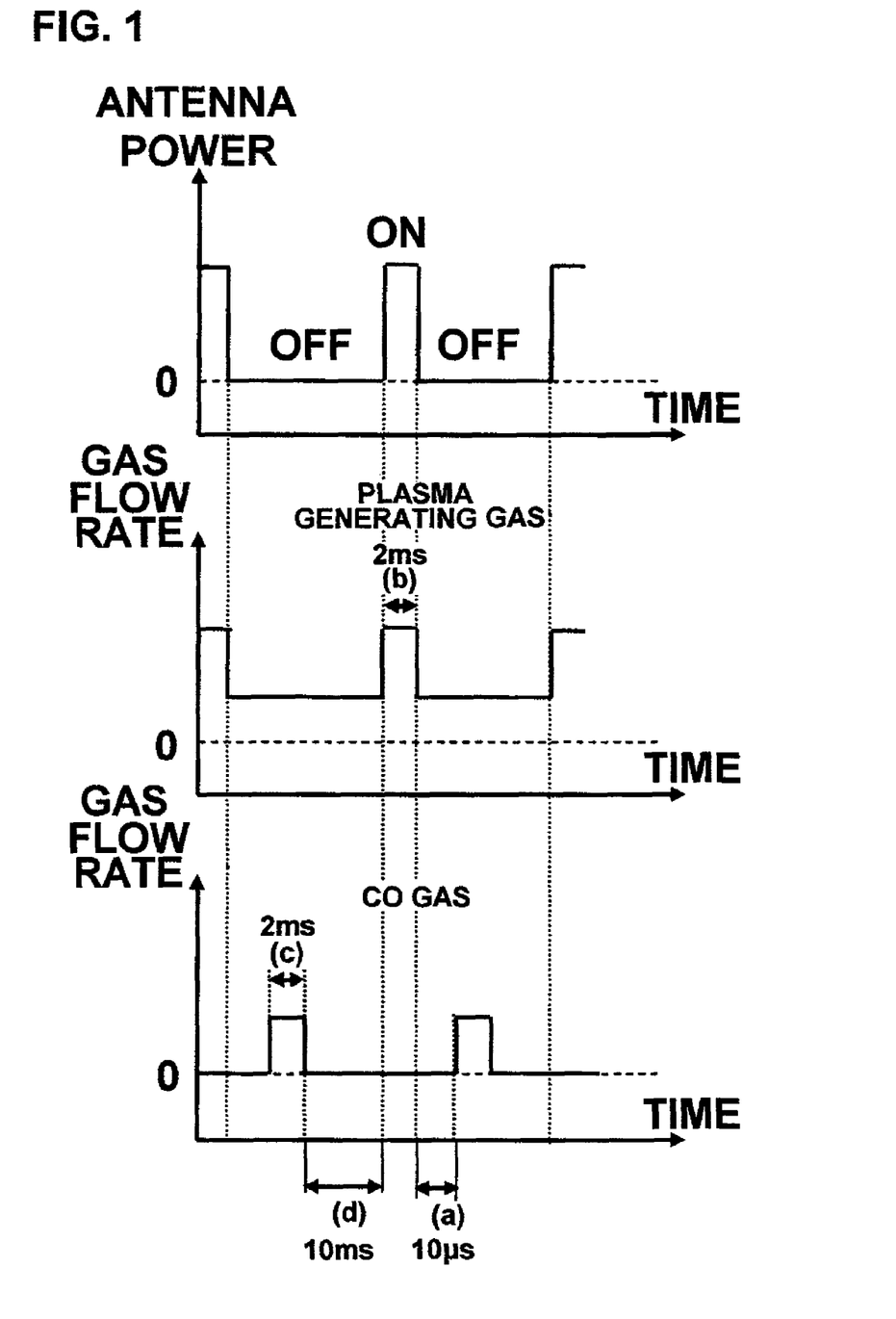
FIG. 1 is a sequence chart showing the time variation of antenna power and process gas supply according to the present invention.

Next, the sequence according to the present invention will be described with reference to FIG. 1 showing the typical example of a sequence chart showing the method for supplying antenna power, the method for supplying plasma generating gas to the vacuum reactor and the method for supplying CO gas to the vacuum reactor, and the graph of FIG. 2 showing the time variation of antenna power, electron temperature and plasma density when the antenna power is time-modulated.

As shown in FIG. 2, when the antenna power is time-modulated, the following behavior is periodically repeated in which the electron temperature increases instantly when the antenna power is turned on, but soon thereafter the electron temperature becomes constant, and the electron temperature drops instantly when the antenna power is turned off.

On the other hand, the plasma density will not vary greatly when the antenna power is time-modulated.

In other words, according to the computation result of Pramod Subramonium disclosed in non-patent document 3, for example, it is reported that when time-modulated plasma is performed using Ar gas with a processing pressure of 20 mTorr, an ICP power of 300 W, a pulse frequency of 10 kHz and a duty ratio of 30%, the plasma density will be $1.0 \times 10^{12}$ cm$^{-3}$ when the antenna power is turned on and will only be reduced to $2.0 \times 10^{11}$ cm$^{-3}$ even when the antenna power is turned off, so that it is confirmed that the plasma density of $1.0 \times 10^{9}$ cm$^{-3}$ or higher considered to be required for etching is maintained during all conditions.

On the other hand, according to the computation results, it is reported that the electron temperature increases to 4.7 eV instantly when the antenna power is turned on, stabilizes at 2.8 eV, and drops to 0.15 eV when the antenna power is turned off.

Therefore, if CO gas is supplied to the plasma when the antenna power is turned off and the electron temperature drops to 1 eV or smaller, it becomes possible to excite the CO while suppressing the dissociation of CO, but if CO gas is supplied when the antenna power is turned on and the electron temperature becomes higher than 1 eV, it becomes difficult to suppress the dissociation of CO.

On the other hand, by focusing on the relaxation time of the electron temperature and the plasma density when the antenna power is turned off, in general, the electron temperature is instantly relaxed in the order between 1 μs and 10 μs, whereas the plasma density is gradually relaxed in the order between 1 ms and 10 ms, though it depends on the apparatus, the discharge specifications and the gas species.

In other words, during the time immediately after turning the antenna power off (when 1 μs to 10 μs had passed after turning the antenna power off) to when the antenna power is turned on, the decrease of plasma density is small and the electron temperature is as low as 1 eV or smaller, so that a plasma state suitable for exciting CO while suppressing the dissociation of CO can be maintained.

Therefore, as shown in the sequence chart of FIG. 1, regarding the method for microfabricating a magnetic film via plasma etching using CO gas, etching can be performed in a state suitable for exciting CO while suppressing the dissociation of CO so as to process the magnetic film effectively, by time-modulating the power applied to the antenna for generating plasma, and to feed plasma generating gas for generating plasma to the vacuum reactor when the antenna power is turned on and feed CO gas for reaction with the magnetic film to the vacuum reactor when the antenna power is turned off.

In FIG. 1, CO gas is fed 10 μs after the antenna power is turned off (section (a)), since it is necessary to feed CO gas after the electron temperature has dropped sufficiently to 1 eV or lower. As described, the relaxation time of electron temperature is considered to be between 1 μs and 10 μs.

Therefore, it is desirable that section (a) is greater than the relaxation time of electron temperature, that is, 1 μs or greater.

Furthermore, according to FIG. 1, the feed time of plasma generating gas (section (b)) and the feed time of CO gas (section (c)) is set to 2 ms, but the values of section (a) and section (c) can be set to appropriate values according to the structure of the apparatus or process conditions. However, since the control time of the valve for feeding the process gas into vacuum is 500 μs or greater, it is preferable that section (b) and section (c) is equal to or greater than 500 μs.

In addition, according to FIG. 1, the time after feeding the CO gas to turning the antenna power on (section (d)) is set to 10 ms, so as to suppress the dissociation of CO by turning the antenna power ON in the state where no residual CO gas exists in the plasma. In other words, the length of section (d) depends on the stay time during which CO stays in the plasma. The stay time of CO in the plasma is determined by the following expression based on plasma volume, processing pressure and process gas flow rate.

Stay time=plasma volume×processing pressure/process gas flow rate

For example, when the plasma volume is 0.02 m$^{-3}$, the processing pressure is 0.5 Pa and the process gas flow rate is 600 ccm, the stay time will be approximately 10 ms.

If the length of section (d) is 50 ms or greater, the plasma density will decrease, making it difficult to maintain a plasma density of 1.0×10$^9$ cm$^{-3}$ or greater required for etching. Therefore, it is preferable that the length of section (d) is equal to or smaller than 50 ms. In addition, the time required for the fed gas to be diffused in the vacuum reactor and stabilized is considered to be approximately 1 ms, though it depends on the size and pressure of the vacuum reactor. Therefore, if section (d) is smaller than 1 ms, it becomes impossible to sufficiently feed CO gas in the plasma. Therefore, the length of section (d) should be equal to or greater than 1 ms and equal to or smaller than 50 ms.

Further according to FIG. 1, the antenna power is turned on and off so as to create a height difference in the antenna power to realize time modulation, but it is also possible to apply a little power when the time of the antenna power is low. At this time, in order to set the electron temperature to 1 eV or smaller considered to enable the state in which CO is excited while dissociation of CO is suppressed to be maintained, it is preferable to apply a power of 1/10 or smaller when the time of the antenna power is low compared to when the time of the antenna power is high.

According to the present method, any gas capable of generating and maintaining plasma in the applied antenna power can be used as the plasma generating gas, but it is especially preferable to use a rare gas such as He, Ar, Xe and the like or a mixed gas thereof capable of easily generating plasma but which does not easily cause chemical reaction within the plasma.

Further, regarding the sequence chart of FIG. 1, it is possible to feed only CO gas and not feed plasma generating gas to the vacuum reactor when the antenna power is turned off, but it is difficult to maintain plasma by only using CO gas, so it is more preferable to feed the plasma generating gas and the CO gas in a mixture as shown in FIG. 1.

In addition, it is possible to set the plasma generating gas flow rate to be constant so as not to depend on the time modulation of the antenna, and only the CO gas can be modulated to correspond to the antenna, but in order to prevent the processing pressure within the vacuum reactor to vary significantly by the significant change of gas flow rate during processing, it is preferable to modulate the plasma generating gas in response to the CO gas so that the total gas flow rate adding together the CO gas and the plasma generating gas is substantially constant.

An actual example of the plasma etching apparatus using the sequence of the present invention will be described using the schematic structural view of FIG. 4 as a first preferred embodiment of the present invention.

A movable electrode 403 for placing a substrate 402 having a magnetic film formed on the upper surface thereof is disposed at a center of the lower portion of the vacuum reactor 401. The electrode is projected to the outer side of the substrate via a vacuum bellows 404, wherein by moving the movable electrode in the direction of arrow (a), the height of the movable electrode 403 and the substrate 402 placed on the movable electrode can be set to an arbitrary value corresponding to process conditions.

The plasma generating gas fed through a first gas inlet 405 disposed on the upper portion of the apparatus and the CO gas fed through the second gas inlet 406 are constantly discharged to the exterior of the vacuum reactor 401 through an air outlet port 407 during the process. At this time, the interior of the vacuum reactor 401 is controlled to predetermined pressure via a pressure control valve 408 disposed on an upper portion of the air outlet port 407.

A high frequency power of 13.56 MHz output from the first high frequency power supply 409 is time-modulated via a modulator 401 and then applied to an antenna 411, and a plasma generating gas is supplied via the first gas inlet 405 and CO gas is supplied via the second gas inlet 406 to thereby generate plasma 414. At this time, the plasma generating gas and CO gas fed through the first gas inlet 405 and the second gas inlet 406 can be supplied into the vacuum reactor 401 during an arbitrary period of time by controlling flow rate control valves disposed on the respective inlets via a gas controller 412. Furthermore, the modulator 410 and the gas controller 412 are connected via a synchronizing circuit 413, so that the gases fed through the first gas inlet 405 and the second gas inlet 406 can be controlled in correspondence with the high frequency power applied to the antenna 411.

According to this arrangement, it becomes possible to control the gas flow rate of the plasma generating gas fed through the first gas inlet 405 formed on both sides of the vacuum reactor 401, the gas flow rate of the CO gas fed through the second gas inlet 406 formed on the center of the vacuum reactor 401 and the high frequency power applied to the antenna power 411 according to the above-described sequence, so as to suppress the dissociation of CO within the plasma 414 and to generate an active species for promoting the reaction between the magnetic film and CO.

Furthermore, the positive ions in the plasma generated by forming plasma from plasma generating gas are drawn toward the substrate 402 via the high frequency power 415 of 400 kHz to 13.56 MHz applied to the movable electrode 403. Thereby, the magnetic film formed on the substrate can be etched effectively via the reaction caused by active species generated from CO gas and the impact caused by the positive ions.

Figure 4:
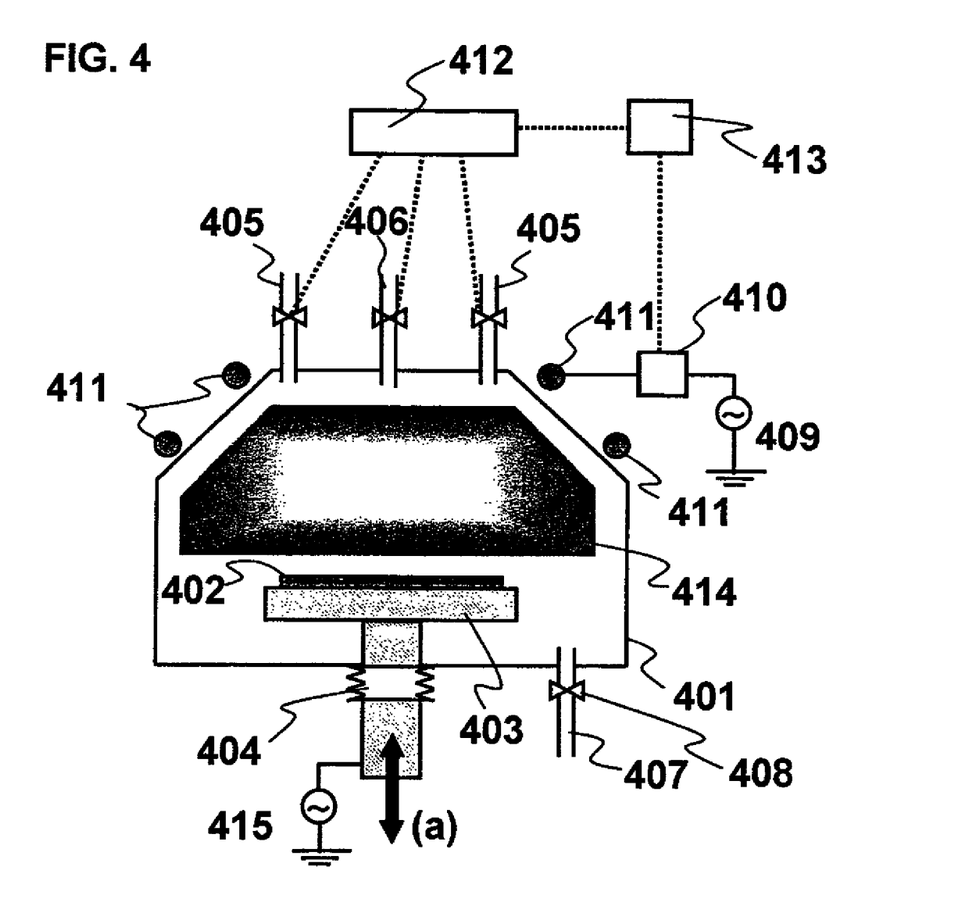
FIG. 4 is a schematic structural view of the plasma etching apparatus having applied the present invention, which is a first embodiment of the present invention.

In FIG. 4, the antenna 411 is arranged so that two turns of antenna are wound around the upper area and the lower area of the vacuum reactor 401, however, the number of turns can be selected from any number between one and ten. Furthermore, when the number of turns is set to three turns or greater, the interval between antennas does not have to be even, in order to control the plasma distribution within the vacuum reactor to an arbitrary distribution.

Further according to the above arrangement, plasma generating gas is fed from the first gas inlet 405 disposed on the upper portion of the vacuum reactor and CO is fed from the second gas inlet 406, however, it is also possible to feed CO from the first gas inlet 405 and plasma generating gas from the second gas inlet 406. However, in order to minimize the reduction of the generated active species of CO caused by the collision with the vacuum reactor 401, it is preferable to feed plasma generating gas from the first gas inlets 405 disposed on the sides and feed CO from the second gas inlet 406 disposed on the center area of the vacuum reactor.

Furthermore, it is possible to dispose only the first gas inlet 405 and feed both CO and plasma generating gas through the first gas inlet, but it is more preferable to dispose the first gas inlet 405 and the second gas inlet 406 separately so as to prevent the CO residing in the gas inlet from mixing in and entering the vacuum reactor during the time for feeding plasma generating gas.

The first gas inlet 405 and the second gas inlet 406 can be disposed on the wall of the vacuum reactor 401, but the gases should preferably be fed from the upper portion of the vacuum reactor so as to diffuse and uniformly distribute the gas fed through the gas inlets and to improve the circumferential uniformity of plasma.

FIG. 4 illustrates a plasma etching apparatus using ICP, but the sequence according to the present invention can adopt other discharge methods using CCP, ECR plasma, helicon-wave plasma, surface wave plasma, and so on.

Another example of the plasma etching apparatus adopting the sequence of the present invention will be described using the schematic structural diagram of FIG. 5 as a second embodiment of the present invention.

A movable electrode 403 for supporting a substrate 402 having a magnetic film formed on the upper surface thereof is disposed at a center of the lower portion of the vacuum reactor 401. The electrode is projected to the outer side of the substrate via a vacuum bellows 404, wherein by moving the movable electrode in the direction of arrow (a), the height of the movable electrode 403 and the substrate 402 placed on the movable electrode can be set to an arbitrary value corresponding to process conditions. The plasma generating gas fed through the first gas inlet 405 disposed on the upper portion of the apparatus and the CO gas fed through the second gas inlet 501 extending close to the upper surface of the substrate 402 are constantly discharged to the exterior of the vacuum reactor 401 through an air outlet port 407. At this time, the interior of the vacuum reactor 401 is controlled to a predetermined pressure via a pressure control valve 408 disposed above the air outlet port 407.

The high frequency power of 13.56 MHz output from the first high frequency power supply 409 is time-modulated via the modulator 410 and then applied to the antenna 411, and plasma 414 is generated by feeding process gas through the first gas inlet 405 and the second gas inlet 501. At this time, the process gas can be supplied for an arbitrary period of time through the first gas supply port 405 and the second long gas supply port 501 into the vacuum reactor 401 by controlling first and second flow rate control valves disposed respectively to the first gas supply port 405 and the second long gas supply port 501 via a gas controller 412.

Furthermore, the modulator 410 and the gas controller 412 are connected via a synchronizing circuit 413, and the process gas fed through the first gas inlet 405 and the second gas inlet 501 can be controlled to correspond to the high frequency power applied to the antenna 411. According to this arrangement, it becomes possible to control the gas flow rate of the gas fed through the first gas inlet 405, the gas flow rate of the gas fed through the second gas inlet 501 extending to reach the area near the upper surface of the substrate 402 and the high frequency power applied to the antenna power 411 based on the sequence disclosed in the first embodiment, so as to suppress dissociation of CO within the plasma 414 and to generate active species for promoting the reaction between the magnetic film and CO.

Furthermore, in the plasma, the positive ions generated by forming plasma from the plasma generating gas is drawn toward the substrate 402 by the high frequency power 415 of 400 kHz to 13.56 MHz applied to the movable electrode 403. Thereby, the magnetic film formed on the substrate can be etched effectively by the reaction with the active species generated from CO gas and the impact caused by the positive ions.

Figure 5:
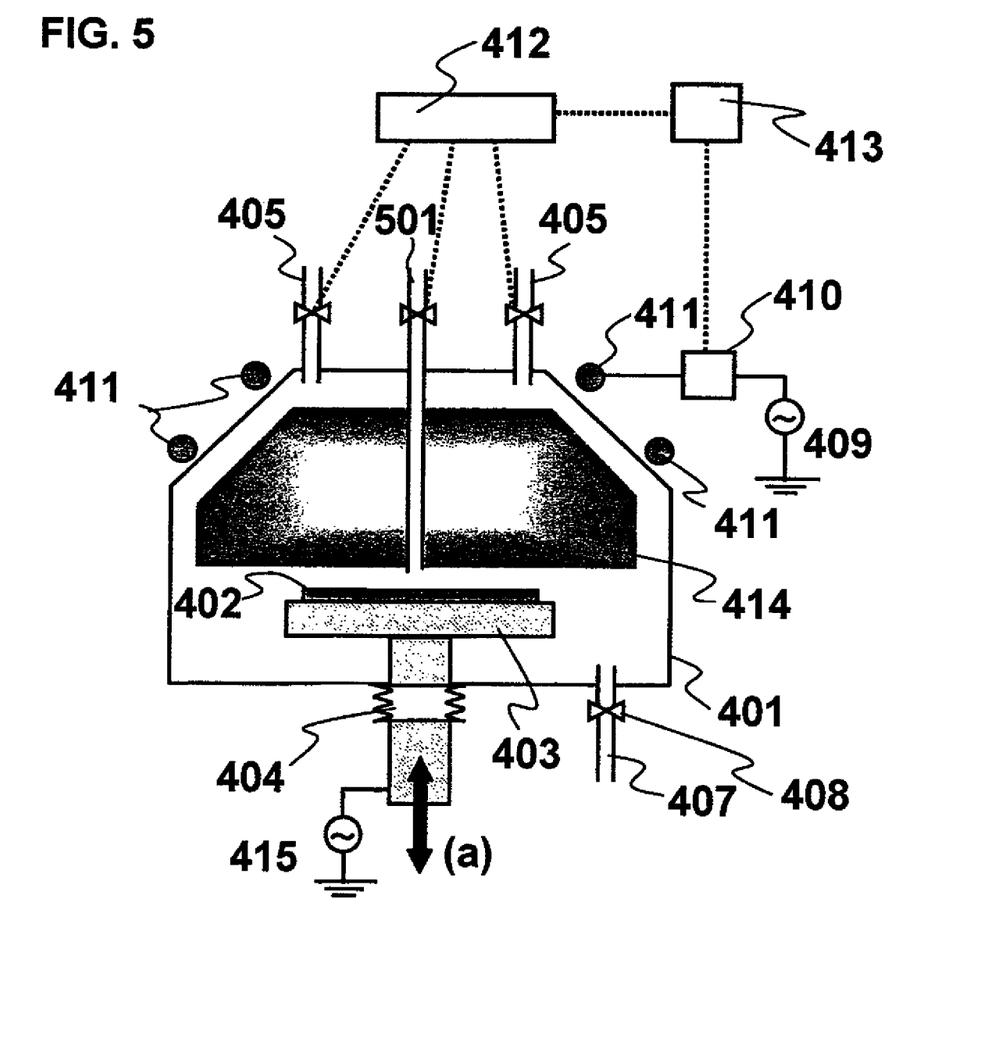
FIG. 5 is a schematic structural view of the plasma etching apparatus having applied the present invention, which is a second embodiment of the present invention.

In FIG. 5, the antenna 411 is arranged so that two turns of antenna are wound around the upper area and the lower area of the vacuum reactor 401, however, the number of turns can be selected from any number between one and ten. Furthermore, when the number of turns is set to three turns or greater, the interval between antennas does not have to be even, in order to control the plasma distribution within the vacuum reactor to an arbitrary distribution.

As shown in FIG. 5, by extending the second gas inlet 501 to reach the area close to the upper surface of the substrate 402, it becomes possible to reduce the distance between the second gas inlet 501 and the wafer, thereby suppressing the chances of CO fed through the second gas inlet 501 being reduced through collision with the vacuum reactor 401 before reaching the wafer, and enabling to supply CO gas effectively to the wafer.

FIG. 5 illustrates a plasma etching apparatus using ICP, but the sequence according to the present invention can adopt other discharge methods using CCP, ECR plasma, helicon-wave plasma, surface wave plasma, and so on.

Figure 6:
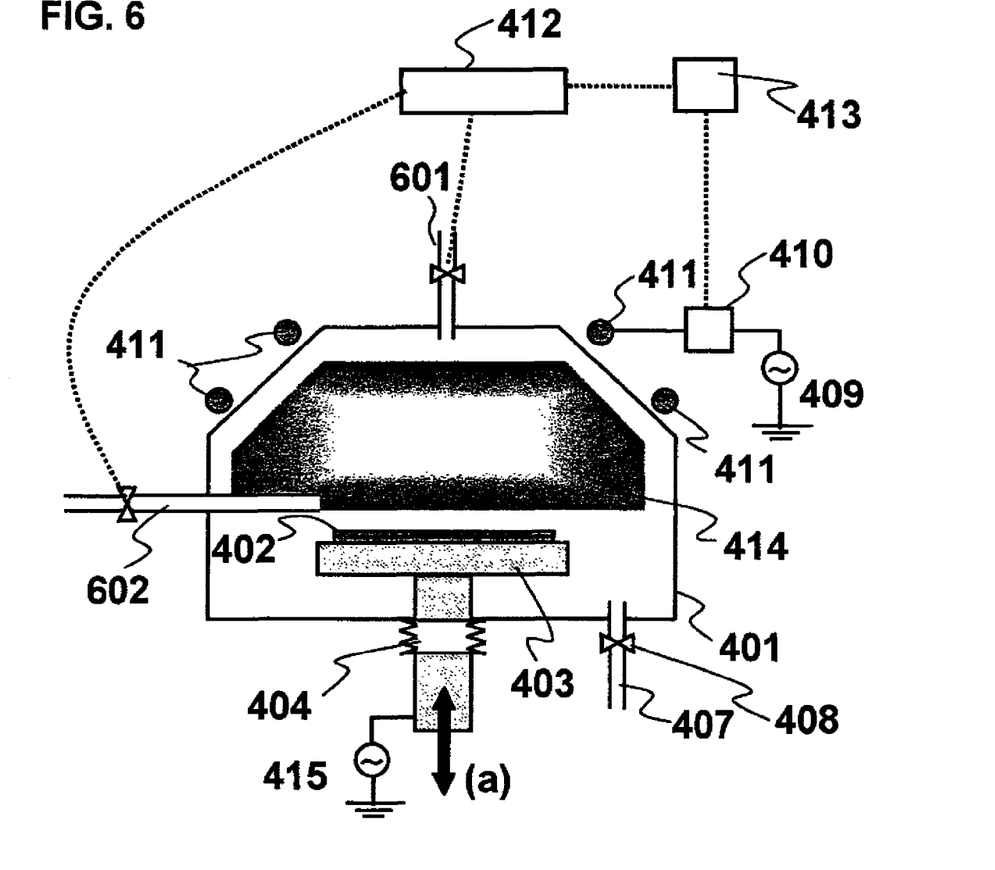
FIG. 6 is a schematic structural view of the plasma etching apparatus having applied the present invention, which is a third embodiment of the present invention.

Another example of the plasma etching apparatus using the sequence of the present invention will be described with reference to the schematic structural view of FIG. 6 illustrating a third embodiment of the present invention.

A movable electrode 403 for supporting a substrate 402 having a magnetic film formed on the upper surface thereof is disposed at the lower center area of the vacuum reactor 401. The movable electrode 403 has a structure protruding to the exterior of the substrate through a vacuum bellows 404, and by moving the movable electrode 403 in the direction of arrow (a), it becomes possible to set the height of the movable electrode 403 and the substrate 402 disposed on the upper surface of the movable electrode 403 to an arbitrary value corresponding to processing conditions. The plasma generating gas fed through the upper gas inlet 601 on the upper portion of the apparatus and the CO gas fed through the lower gas inlet 602 are constantly discharged to the exterior of the vacuum reactor 401 through an air outlet port 407.

At this time, the interior of the vacuum reactor 401 is controlled to predetermined pressure via a pressure control valve 408 disposed on the upper portion of the air outlet port 407. Further, the high frequency power of 13.56 MHz output from the first high frequency power supply 409 is time-modulated by the modulator 410 and then applied to the antenna 411, and process gas composed of plasma generating gas and CO gas is fed through the upper gas inlet 601 and the lower gas inlet 602 to thereby generate plasma 414.

The process gas supplied through the upper gas inlet 601 and the lower gas inlet 602 can be fed to the vacuum reactor 401 for an arbitrary time by controlling the respective valves via a gas controller 412. Further, the modulator 410 and the gas controller 412 are connected via a synchronizing circuit 413, and the process gas fed through the upper gas inlet 601 and the lower gas inlet 602 can be controlled to correspond to the high frequency power applied to the antenna 411.

According to this arrangement, it becomes possible to control the gas flow rate of the gas fed through the upper gas inlet 405, the gas flow rate of the gas fed through the lower gas inlet 406 and the high frequency power applied to the antenna power 411 according to the sequence of the present invention, so as to suppress dissociation of CO within the plasma 414 and to generate an active species for promoting the reaction between the magnetic film and CO.

Further, the positive ions generated by forming plasma from the plasma generating gas are drawn toward the substrate 402 via the high frequency power 415 of 400 kHz to 13.56 MHz applied to the movable electrode 403. Thereby, the magnetic film formed on the substrate can be etched effectively via the reaction by the active species generated by CO gas and the collision caused by positive ions.

In FIG. 6, the antenna 411 is arranged so that two turns of antenna are wound around the upper area and the lower area of the vacuum reactor 401, however, the number of turns can be selected from any number between one and ten. Furthermore, when the number of turns is set to three turns or greater, the interval between antennas does not have to be even, in order to control the plasma distribution within the vacuum reactor to an arbitrary distribution.

As shown in FIG. 6, the distance between the lower gas inlet 602 and the wafer can be shortened by forming the lower gas inlet 602 for feeding CO gas near the wafer, thereby minimizing the chances of CO fed through the lower gas inlet 601 being reduced through collision with the vacuum reactor 401 before reaching the wafer, and enabling to supply CO gas effectively to the wafer.

FIG. 6 illustrates a plasma etching apparatus using ICP, but the sequence according to the present invention can adopt other discharge methods using CCP, ECR plasma, helicon-wave plasma, surface wave plasma, and so on.

Embodiments 1 through 3 illustrate methods for subjecting the antenna power to time modulation and feeding CO gas when the antenna power is either turned off or at a low power, but the dissociation can be suppressed further by mixing $NH_3$ or $H_2$ to the CO gas and feeding the same.

It is also possible to use $CH_3OH$, $C_2H_5OH$, $C_3H_7OH$ or $CO_2$ instead of toxic CO gas to realize a safer process. Thus, in order to enhance the safeness of the process, $CH_3OH$, $C_2H_5OH$, $C_3H_7OH$ or $CO_2$ can be used instead of CO gas as the gas containing C and O.

However, when $CH_3OH$, $C_2H_5OH$, $C_3H_7OH$ or $CO_2$ is used instead of CO, active species of CO may not occur if dissociation is suppressed excessively. Therefore, the antenna power when the time of antenna power is low must be adjusted in response to the process.

As described, the present invention enables to generate an active species for promoting the reaction between the magnetic film and gas containing C and O while suppressing the dissociation of the gas containing C and O, so as to etch the magnetic film formed on the substrate with high efficiency, and to significantly improve the production efficiency of the magnetic film used for example to form magnetoresistive memories.

What is claimed is:

1. A plasma etching method for plasma etching a magnetic film containing at least one element selected from the group consisting of Fe, Co and Ni in a processing chamber using a gas containing C element and O element, the method comprising:
  etching the magnetic film by a time-modulated plasma; and
  supplying a plasma generating gas, that is different from the gas containing C element and O element, to the processing chamber during a period with high amplitude of a time-modulated antenna power,
  wherein a period with low amplitude of the time-modulated antenna power includes a first period, a second period, and a third period,
  the first period is a period in which an electron temperature relaxes, and also is a period in which the gas containing C element and O element is not supplied to the processing chamber,
  the second period is a period in which the gas containing C element and O element is supplied to the processing chamber, and
  the third period is a period in which the gas containing C element and O element is not supplied to the processing chamber.

2. The plasma etching method according to claim 1, wherein
  the plasma generating gas is further fed to the processing chamber during the second period.

3. The plasma etching method according to claim 1, wherein
  the amount of gas containing C element and O element fed during the second period is varied with time.

4. The plasma etching method according to claim 1, wherein
  a rare gas or a mixed gas containing the same is used as the plasma generating gas.

5. The plasma etching method according to claim 1, wherein
  CO, $CH_3OH$, $C_2H_5OH$, $C_3H_7OH$ or $CO_2$ is used as the gas containing C element and O element.

6. The plasma etching method according to claim 1, wherein
  the low amplitude of time-modulated antenna power is $1/10$ or smaller of the high amplitude of time-modulated antenna power.

7. The plasma etching method according to claim 1, wherein the first period is equal to or greater than 1 µs, and the third period is equal to or greater than 1 ms and is equal to or smaller than 50 ms.

8. The plasma etching method according to claim 1, wherein $H_2$ gas or $NH_3$ gas is further supplied to the processing chamber during the second period.

9. The plasma etching method according to claim 4, wherein said rare gas is selected from the group consisting of He, Ar and Xe.

* * * * *